United States Patent [19]
Lee et al.

[11] Patent Number: 5,241,206
[45] Date of Patent: Aug. 31, 1993

[54] SELF-ALIGNED VERTICAL INTRINSIC RESISTANCE

[75] Inventors: Ruojia Lee, Boise; Monte Manning, Kuna, both of Id.

[73] Assignee: Micron Technology, Inc., Boise, Id.

[21] Appl. No.: 955,941

[22] Filed: Oct. 2, 1992

Related U.S. Application Data

[62] Division of Ser. No. 725,138, Jul. 3, 1991, Pat. No. 5,177,030.

[51] Int. Cl.$^5$ .................. H01L 27/02; H01L 27/12; H01L 27/01
[52] U.S. Cl. .................. 257/380; 257/379; 257/536; 257/537; 257/538; 257/903; 257/904
[58] Field of Search ............... 257/903, 904, 379, 380, 257/381, 536, 537, 538

[56] References Cited

U.S. PATENT DOCUMENTS

| | | | |
|---|---|---|---|
| 4,178,674 | 12/1979 | Liu et al. | 257/904 |
| 4,631,705 | 12/1986 | Honda | 257/904 |
| 4,690,728 | 9/1987 | Tsang et al. | 156/643 |
| 4,828,629 | 5/1989 | Ikeda et al. | 257/904 |
| 4,849,801 | 7/1989 | Honjyo et al. | 257/381 |
| 4,961,103 | 10/1990 | Saitoh et al. | 257/903 |
| 5,034,797 | 7/1991 | Tamanaka et al. | 257/538 |

Primary Examiner—Ngan Ngo
Attorney, Agent, or Firm—David J. Paul

[57] ABSTRACT

A self-aligned vertical intrinsic resistance for use in semiconductor devices is developed. The self-aligned vertical intrinsic resistance may be used in a variety of designs, such as functioning as a pullup device in integrated circuits and more specifically for use as a pullup resistor in SRAM devices. The vertical positioning of the intrinsic resistance not only takes up less die space but also allows for a simple process to construct the resistance by eliminating a photomask step that is normally required prior to implanting an intrinsic resistance used in conventional fabrication processes.

21 Claims, 4 Drawing Sheets

SELF-ALIGNED VERTICAL INTRINSIC RESISTANCE

This is a divisional of U.S. Ser. No. 725,138, filed Jul. 3, 1991, now U.S. Pat. No. 5,177,030 issued Jan. 5, 1993.

FIELD OF THE INVENTION

This invention relates to semiconductor devices and more particularly to a process to fabricate a self-aligned vertical intrinsic resistor for use in Static Random Access Memories (SRAMs).

BACKGROUND OF THE INVENTION

One of the common elements required in electrical circuit devices is the simple pull up (or pull down device) from an active device to one of the power supply buses. The pull up is simple if used to construct a circuit using discrete components in that all that is required is selecting a resistor of the desired resistance and tolerance, connecting it between an active device, such as an open collector transistor, and $V_{cc}$ and the transistor's output would be pulled up to $V_{cc}$ once the transistor is forward biased. With the advent of the integrated circuit (IC) however, fabricating a resistance onto a wafer substrate, such as silicon or gallium arsenide, takes special consideration particularly when resistivity and tolerances play an important part in circuit operation.

For example, as SRAMs have evolved from the small 4 Kb memory arrays to more densely packed array sizes, tolerances of pull up resistances had to be tightly controlled. In order to minimize standby current many fabrication processes adopted using an active device as the pull up. In CMOS fabrication it is common to see a PMOS transistor acting as the current path between a memory cell access transistor and the power supply bus. In this manner the PMOS could be gated on only when the desired line was to be pulled to $V_{cc}$ and turned off otherwise, thereby virtually eliminating leakage current and minimizing standby current for the SRAM device as a whole.

The main drawback to using an active device for a pull up device is the amount of space required to fabricate the device. Now that the SRAM generation has grown to the 1 Mb array size, die space is a critical factor to consider, especially as arrays become even more dense. Technology has basically pushed all types of ICs to be more densely packed and pull ups are a common element in many circuit designs.

The present invention introduces a unique method to fabricate a self-aligned vertical intrinsic resistance, having low leakage properties, to replace an active device pull up while requiring less die space.

SUMMARY OF THE INVENTION

The invention is directed to a self-aligned vertical intrinsic resistance and a process for fabricating the same. The self-aligned vertical intrinsic resistance may be used as a pullup device in integrated circuits and more specifically for use as a pullup resistor in SRAM devices.

The vertical positioning of the intrinsic resistance described herein provides several advantages over conventional methods used to construct pull up devices. One advantage being less die space is required, another being the vertical resistance is self-aligned thereby eliminating a photomask step that is normally required prior to conductively implanting the resistance.

DETAILED DESCRIPTION OF THE PREFERRED EMBODIMENT

The present invention is directed to a self-aligned vertical intrinsic resistor and a process for fabricating the same. The process steps are integrated into a conventional SRAM fabrication process to form a self-aligned vertical intrinsic resistor as a pull up resistor to an SRAM storage cell. The process to develop the SRAM pull up resistor is described in a sequence shown in FIGS. 2–6 in conjunction with previous SRAM fabrication in FIG. 1 and subsequent SRAM fabrication in FIGS. 7 and 8.

Figure 1:
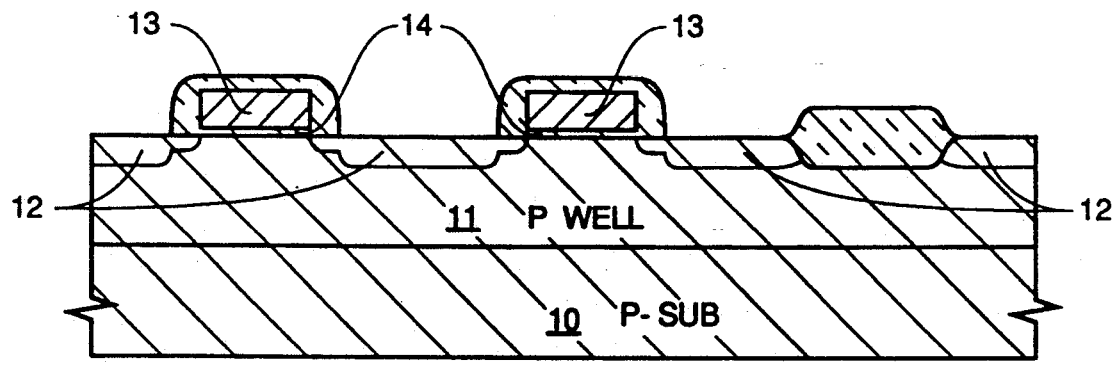
FIG. 1 shows a cross-sectional view of an in-process wafer portion having a p-well implanted into a p-substrate with N+ source/drain diffusion regions implanted into the p-well, said diffusion regions are self-aligned to poly gates to form NMOS transistors for an SRAM storage cell.

As shown in FIG. 1, a silicon wafer is fabricated using conventional process steps, known to one skilled in the art, up to the point of having formed a p-well region 11 into wafer substrate 10. N+diffusion regions 12 have been implanted into p-well region 11. Polysilicon (or poly) gates 13 and gate insulative oxide 14 bridge the desired diffusion regions 12 and form NMOS active devices to an SRAM storage cell.

The process steps, illustrated in FIGS. 2–6, for the present invention of forming a self-aligned vertical intrinsic resistor will now follow.

Figure 2:
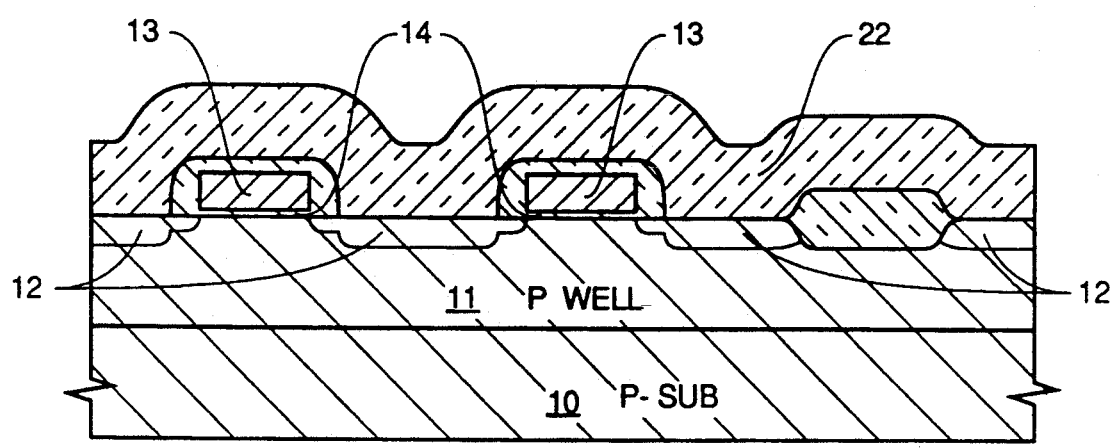
FIG. 2 shows a cross-sectional view of the in-process wafer portion of FIG. 1 after a deposition of thick oxide.

Referring now to FIG. 2, a thick layer of oxide 22, preferably 5000Å thick, is deposited over the existing wafer surface illustrated in FIG. 1. Thick oxide 22 provides for a steep vertical edge (formed during the following photomask step) which is required for the intrinsic resistor.

Figure 3:
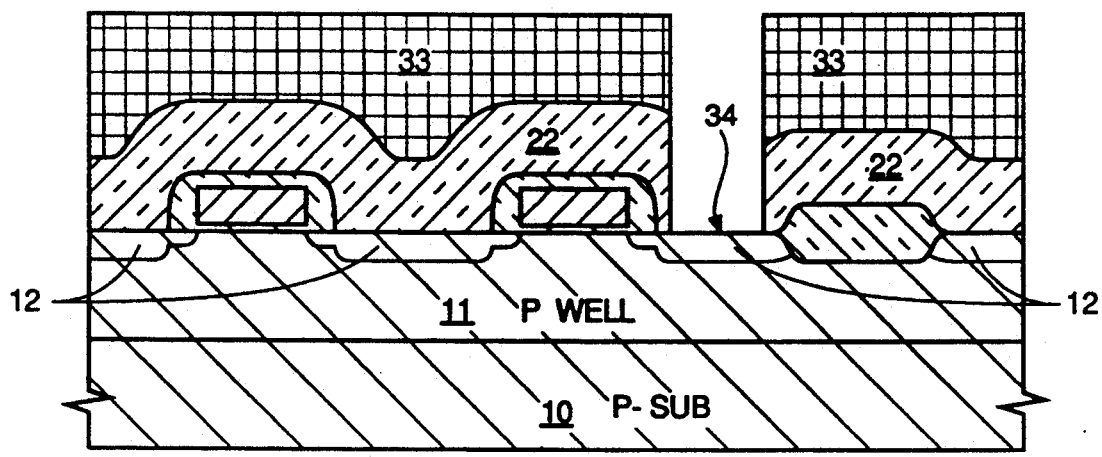
FIG. 3 shows a cross-sectional view of the in-process wafer portion of FIG. 2 after patterning and etch of a first buried contact location.

Referring now to FIG. 3, oxide 22 is covered with photoresist 33 and an appropriate photomask is used to form a buried contact location 34 following an anisotropic etch.

Figure 4:
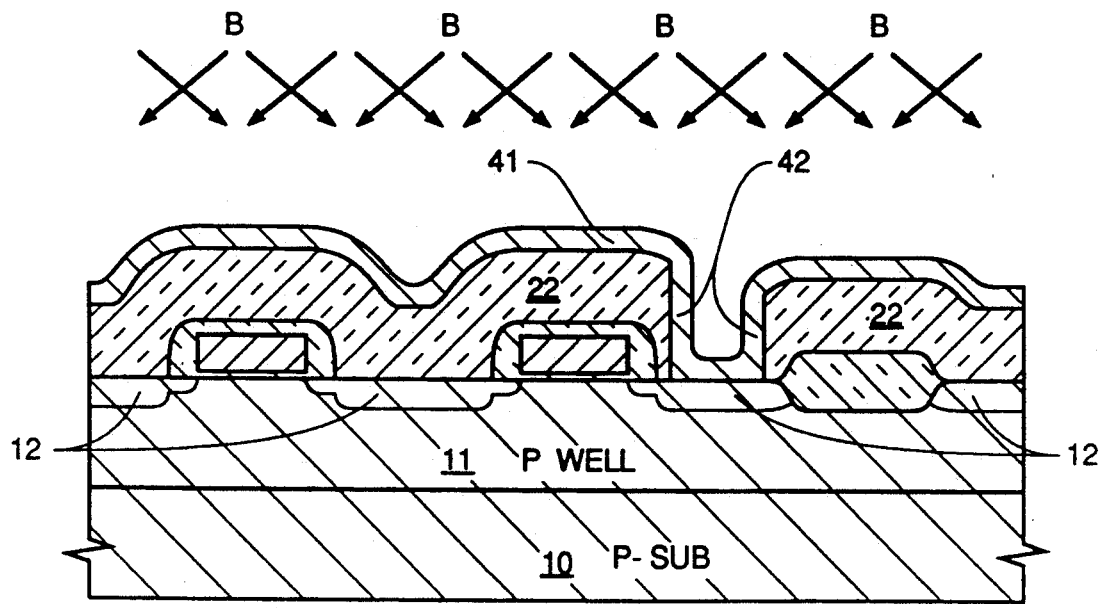
FIG. 4 shows a cross-sectional view of the in-process wafer portion of FIG. 3 after a photoresist strip, a deposition of a thin layer of conformal polysilicon and a high angle blanket boron implant.

Referring now to FIG. 4, photoresist 33 (seen in FIG. 3) has been stripped and a thin layer of conformal poly 41 is deposited. Poly 41 can be lightly doped to p-conductivity by a number of ways. One method would be by in-situ doping poly 41 with boron during deposition. A second method is by implanting boron at a severe angle (10°-60° from vertical) so that a vertical poly 42 of poly 41 is exposed to the boron and thereby become slightly doped p−. Vertical poly 42 will form the self-aligned vertical intrinsic resistor of the present invention.

Figure 5:
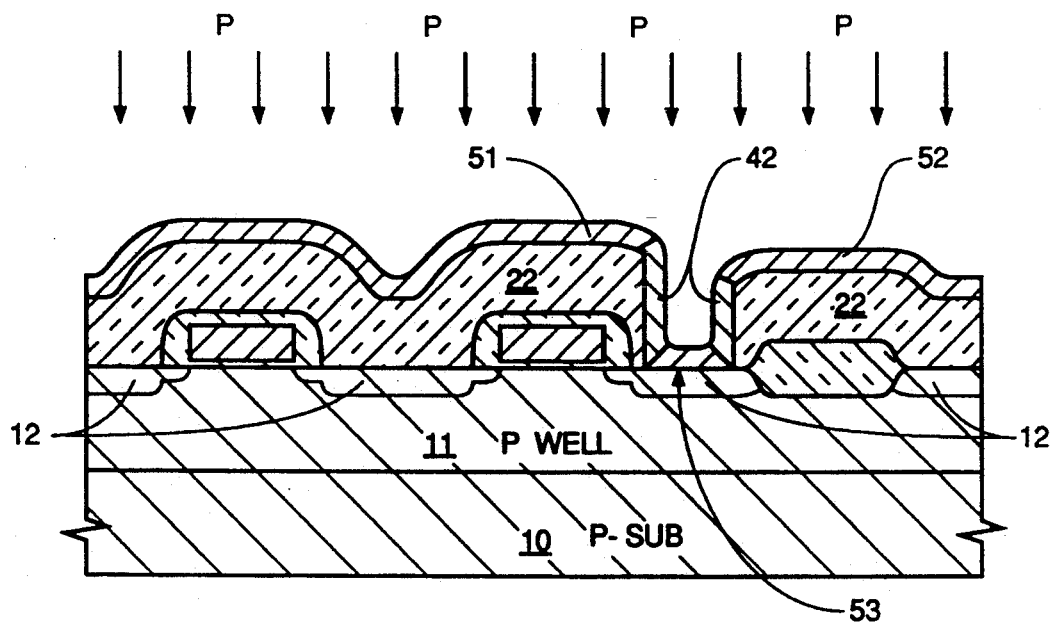
FIG. 5 shows a cross-sectional view of the in-process wafer portion of FIG. 4 after a 0° phosphorus implant.

Referring now to FIG. 5, poly 41 is heavily doped N+ by implanting either arsenic or phosphorus at a 0° angle in order to form low resistive poly 51 and 52 (running basically horizontal to poly 42) on either end of vertical poly 42. The low resistive poly connecting to the lower end of vertical poly 42 forms a low resistive contact 53 with the underlying diffusion region 12.

As one skilled in the art would suspect, the conductivity types of the horizontal portions 51 and 52 and vertical polysilicon portion 42 can be reversed using the appropriate dopant impurities. In other words, the horizontal polysilicon portions 51 and 52 may be doped to p+ conductivity and the vertical polysilicon portion 42 may be doped to n− conductivity in order to conform to the designer's need.

Figure 6:
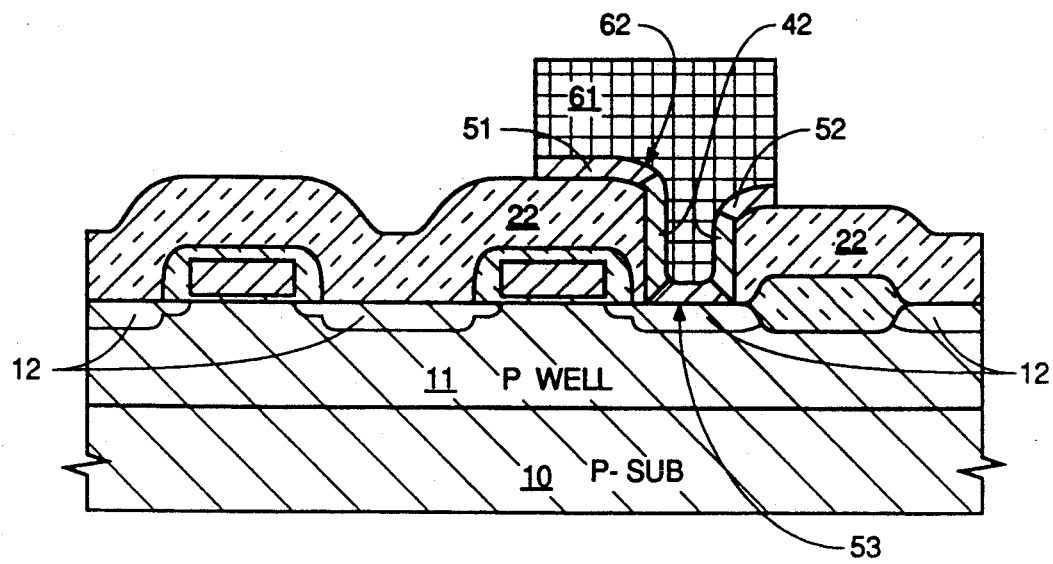
FIG. 6 shows a cross-sectional view of the in-process wafer portion of FIG. 5 after patterning and etching to form an intrinsic resistor.

Referring now to FIG. 6, photoresist is placed and masked in order to form resistive structure 62 comprising low resistive poly 51 and 52 attached to vertical poly 42 following a subsequent anisotropic etch.

Figure 7:
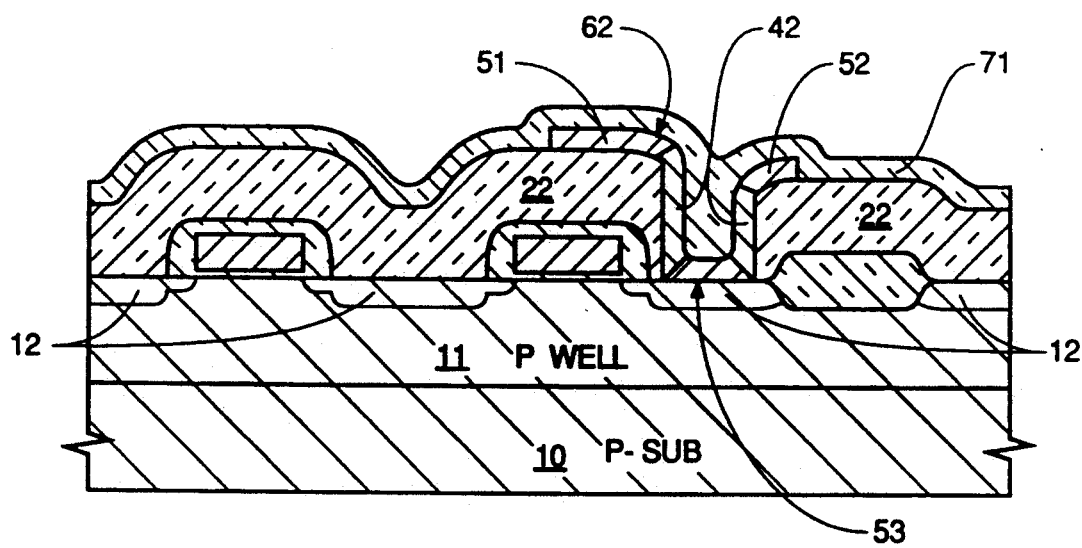
FIG. 7 shows a cross-sectional view of the in-process wafer portion of FIG. 6 after a deposition of conformal oxide.

Referring now to FIG. 7, oxide 71 is formed to isolate resistive structure 62 from subsequent conductive layers that may be deposited later in the process.

Figure 8:
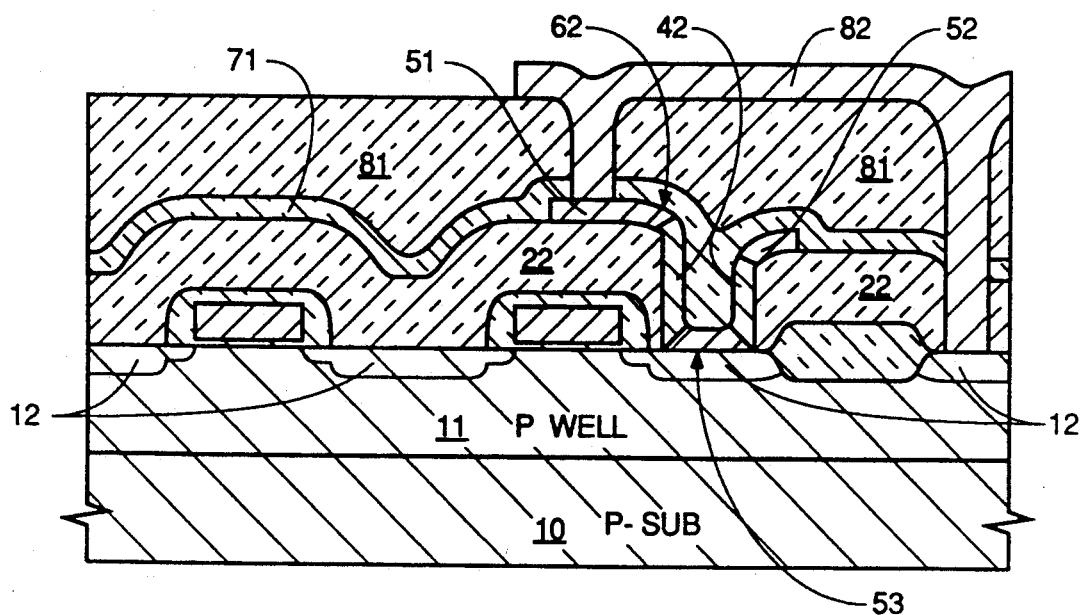
FIG. 8 shows a cross-sectional view of an in-process wafer portion connecting the intrinsic resistor, developed using the steps of FIGS. 1–6, to an upper layer of metal that will supply $V_{cc}$ to the SRAM pull up and storage cell.

As shown in FIG. 8, the wafer of FIG. 7 has gone through several process steps, known to one skilled in the art, which has put down a Boro Phospho Silicate Glass (BPSG) bpsg protective layer 81, with a via etched opened to allow a subsequent deposition of metal 82 to make contact to resistive structure 62 at its upper low resistive poly 51. Metal 82 provides the electrical connection to $V_{cc}$ and resistive pull up structure 62.

The process steps depicted in FIGS. 1-8 serve as an example for the use of the self-aligned vertical intrinsic resistor in the preferred embodiment. However, one skilled in the art may easily incorporate the process steps of FIGS. 2-6 into an applicable fabrication process where intrinsic resistors may be used and in particular where intrinsic resistors may be used for pull up or pull down purposes.

Therefore, it is to be understood that although the present invention has been described with reference to a preferred embodiment, various modifications, known to those skilled in the art, may be made to the structure and process steps presented herein without departing from the invention as recited in the several claims appended hereto.

We claim:

1. An intrinsic resistance for a semiconductor device fabricated on a wafer substrate, said resistance comprising:
   a) a layer of semiconductive material having substantially horizontal and substantially vertical semiconductive portions;
   b) said vertical semiconductor portion forming said intrinsic resistance, said intrinsic resistance comprising a light doping of first type conductivity; and
   c) said horizontal semiconductive portions conductively doped as a second type conductivity, said horizontal semiconductive portions providing low resistive coupling sections.

2. The intrinsic resistance of claim 1, wherein said first type conductivity is p-type.

3. The intrinsic resistance of claim 1, wherein said first type conductivity is n-type.

4. The intrinsic resistance of claim 1, wherein said second type conductivity is n-type.

5. The intrinsic resistance of claim 1, wherein said second type conductivity is p-type.

6. A substantially vertical intrinsic resistance for a semiconductor device fabricated on a wafer substrate, said resistance comprising:
   a) a layer of semiconductive material having substantially horizontal and substantially vertical semiconductive portions;
   b) said vertical semiconductive portion forming said vertical intrinsic resistance, said intrinsic resistance comprising a light doping of first type conductivity; and
   c) said horizontal semiconductive portions conductively doped as a second type conductivity, said horizontal semiconductive portions providing low resistive coupling sections.

7. The intrinsic resistance of claim 6, wherein said first type conductivity is p-type.

8. The intrinsic resistance of claim 6, wherein said second type conductivity is n-type.

9. The intrinsic resistance of claim 6, wherein said first type conductivity is n-type.

10. The intrinsic resistance of claim 6, wherein said second type conductivity is p-type.

11. The intrinsic resistance of claim 6, wherein said resistance forms a pullup resistor.

12. The intrinsic resistance of claim 6, wherein said resistance forms a pulldown resistor.

13. The intrinsic resistance of claim 6, wherein said semiconductor device is a static random access memory.

14. A static random access memory fabricated on a substrate having an intrinsic resistance, said resistance comprising:
   a) a layer of semiconductive material having substantially horizontal and substantially vertical semiconductive portions;
   b) said vertical semiconductive vertical portion forming said intrinsic resistance, said intrinsic resistance comprising a light doping of first type conductivity; and
   c) said horizontal semiconductive portions conductively doped as a second type conductivity, said horizontal semiconductive portions providing low resistive coupling sections.

15. The intrinsic resistance of claim 14, wherein said first type conductivity is p-type.

16. The intrinsic resistance of claim 14, wherein said first type conductivity is n-type.

17. The intrinsic resistance of claim 14, wherein said second type conductivity is n-type.

18. The intrinsic resistance of claim 14, wherein said second type conductivity is p-type.

19. A static random access memory fabricated on a wafer substrate having a substantially vertical intrinsic resistance, said resistance comprising:
   a) a layer of semiconductive material having substantially horizontal and substantially vertical semiconductive portions;

b) said vertical semiconductive portion forming said vertical intrinsic resistance, said intrinsic resistance comprising a light doping of p-type conductivity; and c) said horizontal semiconductive horizontal portions conductively doped as an n-type conductivity, said horizontal semiconductive portions providing low resistive coupling sections.

20. The intrinsic resistance of claim 19, wherein said resistance forms a pullup resistor.

21. The intrinsic resistance of claim 19, wherein said resistance forms a pulldown resistor.

* * * * *